(12) United States Patent
Khan et al.

(10) Patent No.: US 6,556,099 B2
(45) Date of Patent: Apr. 29, 2003

(54) MULTILAYERED TAPERED TRANSMISSION LINE, DEVICE AND METHOD FOR MAKING THE SAME

(75) Inventors: Andrew Merritt Khan, Schaumburg, IL (US); Shamik Mukherjee, Schaumburg, IL (US); Richard S. Bickham, Cary, IL (US); Lawrence F. Cygan, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 133 days.

(21) Appl. No.: 09/769,886

(22) Filed: Jan. 25, 2001

(65) Prior Publication Data

US 2002/0097110 A1 Jul. 25, 2002

(51) Int. Cl.⁷ .............................. H01P 3/02; H03H 7/38
(52) U.S. Cl. ............................. 333/34; 333/32; 333/246
(58) Field of Search .......................... 333/33, 34, 238, 333/246, 32; 336/232, 200

(56) References Cited

U.S. PATENT DOCUMENTS

| | | | | |
|---|---|---|---|---|
| 3,177,436 A | * | 4/1965 | La Rosa | 333/34 |
| 5,119,048 A | | 6/1992 | Grunwell | 333/34 |
| 5,140,288 A | | 8/1992 | Grunwell | 333/34 |
| 5,467,064 A | | 11/1995 | Gu | 333/128 |
| 5,757,252 A | * | 5/1998 | Cho et al. | 333/246 |
| 5,949,304 A | | 9/1999 | Heine et al. | 333/175 |
| 5,977,850 A | | 11/1999 | Chaturvedi | 333/238 |
| 6,317,002 B1 | * | 11/2001 | Griffiths | 330/295 |
| 6,329,886 B1 | * | 12/2001 | Ogoro | 333/32 |
| 6,341,216 B1 | * | 1/2002 | Itoh | 455/83 |

FOREIGN PATENT DOCUMENTS

| | | |
|---|---|---|
| DE | 1006915 | 4/1957 |
| JP | 09199901 | 7/1997 |
| WO | WO95/20829 | 8/1995 |

OTHER PUBLICATIONS

Burrows, C.R., "The exponential transmission line," Bell System Technical Journal, vol. 17, pp. 555–573, (Oct. 1938).

Mandai & Chigodo, "A low temperature cofired multiplayer ceramic delay line with copper conductors," Electronic Components and Technology Conference Proceedings 1991, pp. 127–133.

* cited by examiner

Primary Examiner—Robert Pascal
Assistant Examiner—Stephen E. Jones
(74) Attorney, Agent, or Firm—William E. Koch

(57) ABSTRACT

A multilayer ceramic device (100) includes a plurality of dielectric layers (104A–G) separated by ground planes (114) and includes a plurality transmission line segments (118) in generally folded configuration for defining a tapered transmission line (102). The profile of the transmission line may vary and includes such profiles as embodied in the depicted lines (200, 206, 212).

17 Claims, 5 Drawing Sheets

MULTILAYERED TAPERED TRANSMISSION LINE, DEVICE AND METHOD FOR MAKING THE SAME

FIELD OF THE INVENTION

The present invention relates to multilayer ceramic devices, and more particularly to multilayer tapered transmission line devices suitable for large bandwidth applications.

BACKGROUND OF THE INVENTION

It is popular in the art to employ transmission lines for signal propagation through the layers of a multilayer ceramic package. For instance, it is common to build multiple layers of such devices by screen printing a conductive paste (e.g., including silver, gold, copper, nickel, palladium, platinum or the like) on layers of a ceramic green tape according to a predetermined pattern. The layers are co-fired to form a dense ceramic package. Vias are typically formed for bridging electrical communication between conductive layers.

In many radio frequency applications, there is a need for impedance matching over a broad range of frequencies. One desirable approach is to employ a tapered transmission line, as is known in the art. However, it has been found that ceramic packaging size constraints have prohibited the optimal design of tapered transmission line devices. Accordingly, there is a need for an improved impedance matching transformer, which is useful over a broad range of frequencies and which can be incorporated into multilayer ceramic packaging for minute size applications.

Illustrative examples of other technological advances in the present general field include that disclosed in U.S. Pat. Nos. 5,119,048; 5,140,288; 5,949,304; and 5,977,850, all of which are hereby expressly incorporated by reference.

DETAILED DESCRIPTION OF THE DRAWINGS

Figure 1:
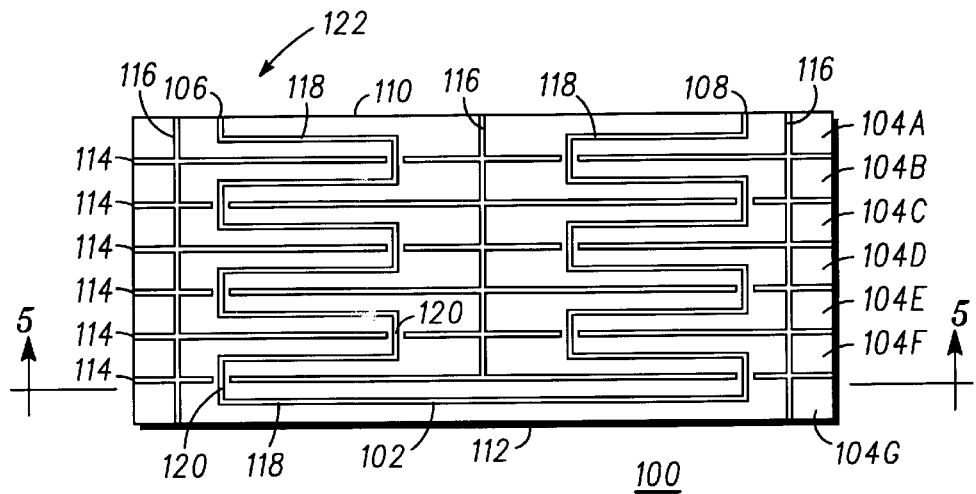
FIG. 1 illustrates a side sectional view of an illustrative multilayer ceramic package in accordance with the present invention.
Figure 2:
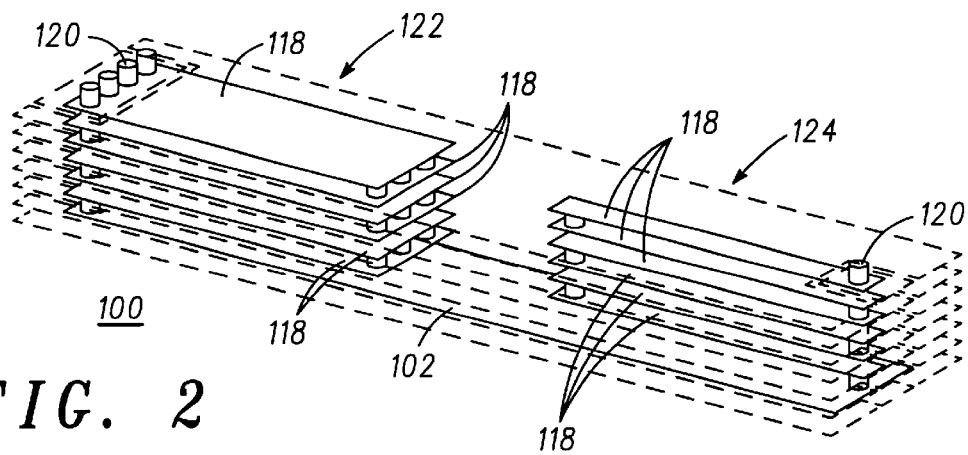
FIG. 2 illustrates a perspective view of one possible folded transmission line configuration corresponding generally to that in the multilayer ceramic package of FIG. 1.
Figure 3:
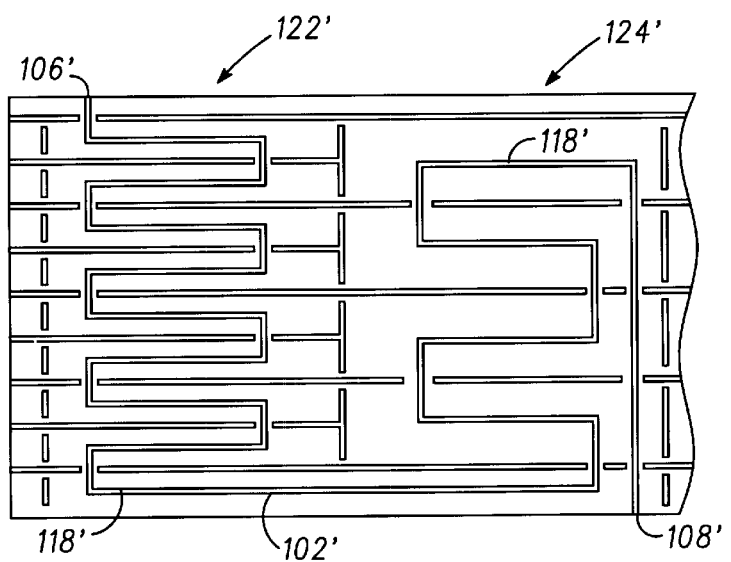
FIG. 3 illustrates a side sectional view of another illustrative multilayer ceramic package in accordance with the present invention showing a difference from the package of FIG. 1 in the input/output arrangement.
Figure 6A:
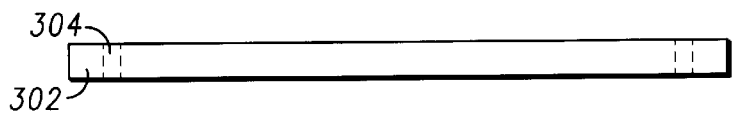
FIGS. 6A–6C are sectional views illustrating steps in the fabrication of a multilayer ceramic package in accordance with the present invention.
Figure 6B:
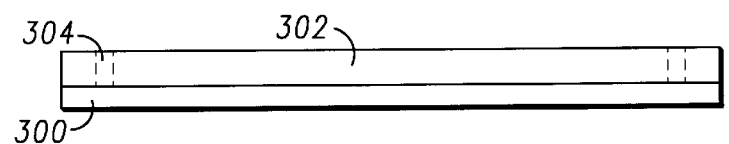
Figure 6C:
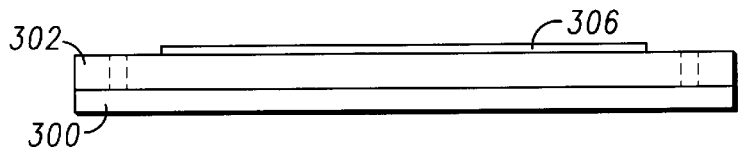
Figure 6D:
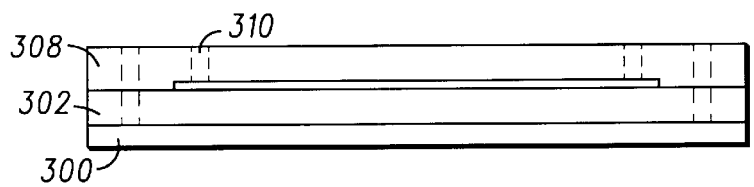
Figure 6E:
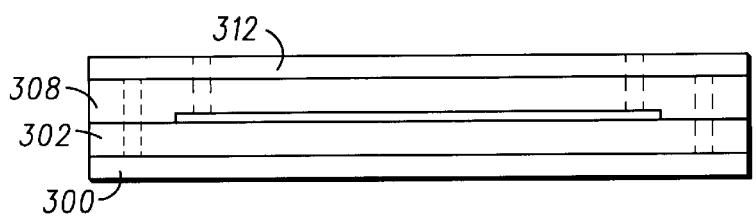
Figure 6F:
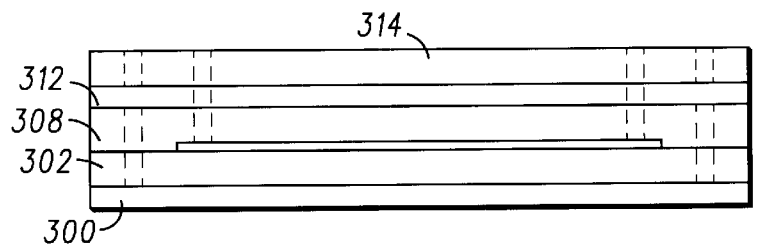
Figure 6G:
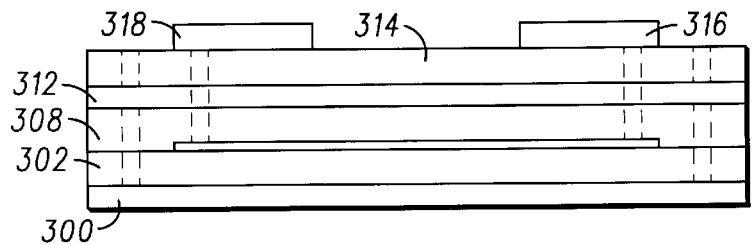

Referring to FIGS. 1 and 2, there is depicted a multilayer ceramic package 100 with a tapered transmission line 102 in accordance with the present invention. The multilayer ceramic package 100 includes a plurality of ceramic layers labeled 104A through 104G respectively. Each layer of 104 actually comprises two dielectric layers and three metal layers as shown in FIG. 6E. A first port 106, such as an input electrode, is formed in dielectric layer 104A. A second port 108 is also formed in the dielectric layer 104A; it being recognized that in an alternative device 100' (where like reference numerals represent like components), the first port 106' and the second port 108' may be formed in different layers relative to one another, as is illustrated in FIG. 3. An advantage of having port 106 and port 108 on the same layer, however, is that it can be used in a common surface mount configuration.

Additionally, a first ground plane 110 is formed on a surface of dielectric layer 104A and a second ground plane 112 is formed on a surface of dielectric layer 104G. Optionally, a plurality of intermediate ground planes 114 is disposed within the package 100, and separating one or more of the respective dielectric layers. The ground planes are connected relative to each other by a plurality of vias 116.

The tapered transmission line 102 preferably includes a plurality of transmission line segments 118, with one or more of such segments being disposed in a different layer of the package. Transmission line segments 118 are strategically located relative to dielectric layers 104A–G inside the multilayer ceramic package 100. The transmission lines may also be referred to as electrodes formed in the dielectric ceramic layers 104A–104G. A series of through holes or vias (not shown) are typically punched into the dielectric layers 104A–104G and metallized with a conductive material to form via connectors (a number of which are designated by reference numeral 120) and thereby connect the transmission line segments, a number of which are designated by reference numeral 118. In one embodiment, the transverse cross-sectional area of the via connectors 120 optionally approximates the cross-sectional area of the respective transmission line segments 118 to which they connect.

Each of the transmission line segments 118 is configured to differ in width or characteristic impedance relative to its respective adjacent segments. Preferably, however, the segments collectively would perform substantially characteristic of one of the tapered transmission lines depicted in FIGS. 4A–4C. Thus, in a particularly preferred embodiment, if laid end to end, the shape of the segments substantially resembles one of the tapered transmission lines 200, 206 or 212 respectively depicted in FIGS. 4A–4C.

Preferably, the respective transmission line segments 118 are stacked relative to each other in their respective layers, and are connected by the via connections 120. In one preferred embodiment, as depicted in FIG. 1, each segment has a longitudinal axis and the segments are stacked so that their longitudinal axes are generally axially aligned. This is not intended as limiting, however, as other relative orientations (e.g., orthogonal, angular, or the like) may be employed for placement of the respective segments relative to each other in their respective layers. The overall structural effect is to create a folding type configuration, where the segments fold adjacent to one another.

FIG. 3 illustrates an alternative design relative to the design of FIGS. 1 and 2. As noted previously, in FIG. 3, the first port 106' is disposed in a different layer relative to the second port 108'. Further, the segments are shown staggered among intermittent layers in a first portion 122' of the device and staggered further between additional layers in a second portion 124' of the device. Either or both of these modifications (i.e., port location or layer staggering) may be made to the devices of FIGS. 1 and 2, as well as other modifications for tuning the performance of a device for its respective application.

Figure 4A:
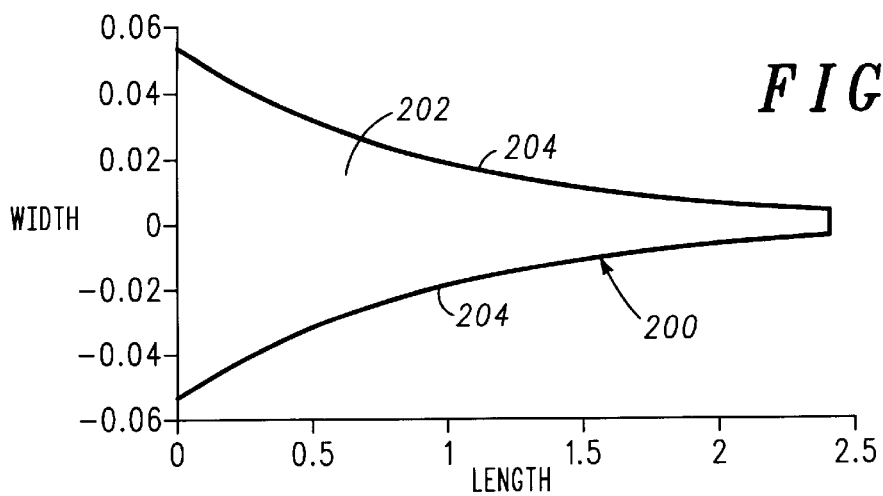
FIGS. 4A–4C illustrate three examples of transmission line profiles.

FIG. 4 illustrates examples of transmission line profiles that are simulated by the respective transmission line segments of the devices of the present invention. A first line 200, illustrated in FIG. 4A has a first profile 202, which includes edges 204 that taper generally exponentially. In one aspect of this embodiment, the resulting impedance profile is described by the equation:

$$Z(x)=Z_0 e^{ax}$$

where both $Z_0$ and a are constants and x is the axial dimension.

Figure 4B:
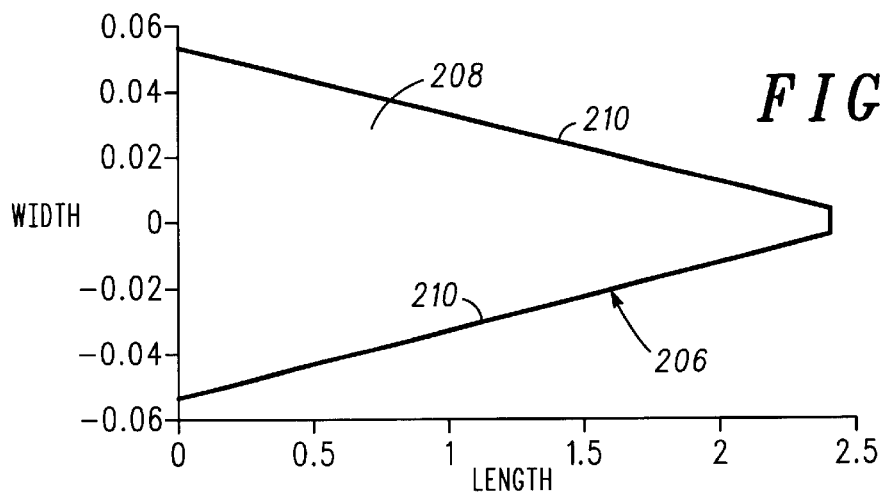
Figure 4C:
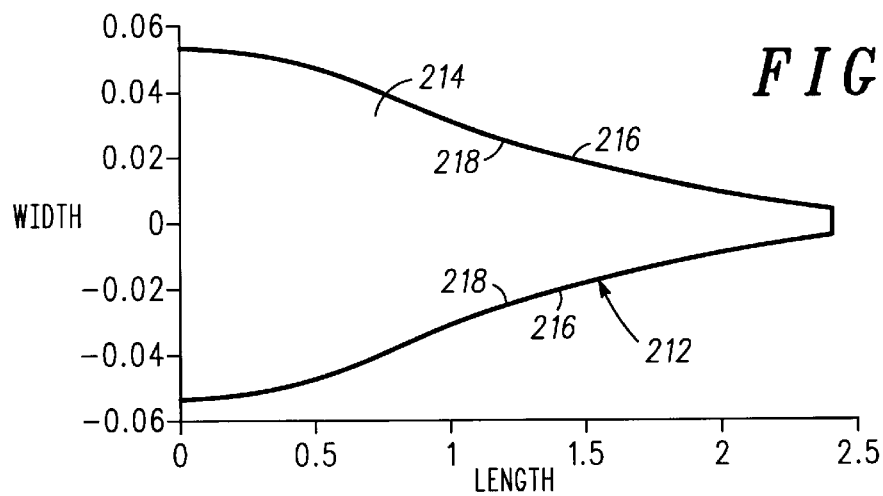

A second line 206, illustrated in FIG. 4B, has a second profile 208, which includes edges 210 that taper generally straight. A third line 212 illustrated in FIG. 4C has a third profile 214, which includes edges 216 that exhibit a curved taper and also include an inflection point 218 (where the curve switches from concave to convex) on each side. The dimensions identified in FIGS. 4A–4C are relative and are not intended as limiting. They may vary from application to application, depending upon the characteristics sought. Further, combinations of the above configurations may be employed, as well as other taper configurations.

While in one preferred embodiment, the objective of simulating the above profiles is accomplished by stacking transmission line segments, it will be appreciated that other techniques may also be employed within the scope of the present invention, including but not limited to reorienting the segments, or intermittently employing a plurality of geometrically suitable sub-segments within a common layer.

Figure 5:
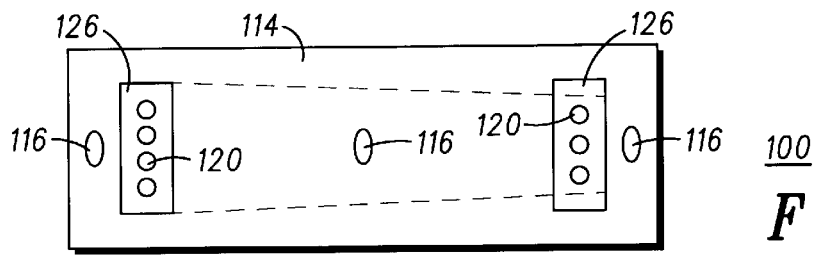
FIG. 5 is a sectional view taken through line 5—5 of FIG. 1.

FIG. 5 illustrates, without limitation, one illustrative way to isolate the via connectors 120 from ground planes within a device 100. A ground plane, such as ground plane 114 is formed in spaced relationship relative to the via connectors, with a coplanar dielectric portion 126 disposed therebetween.

Multilayer ceramic package devices in accordance with the present invention may be made using any suitable technique. Without limitation, the devices may be built layer by layer using a ceramic green tape (having a ceramic material suitable for functioning as a dielectric), with layers of conductive paste (e.g., a matrix including a dispersed particulated conductive metal, such as silver, gold, copper, nickel, palladium, platinum or the like) screen printed or otherwise deposited on the green tape. The devices are densified by sintering at a suitable temperature to form a resulting layer containing a conductive metal. Preferably multiple layers are assembled together and co-fired together. Alternatively, layers can be densified and thereafter assembled.

FIG. 6 shows the sequence of fabrication of a portion of one device, where (FIG. 6A) a first layer of ceramic green tape 302 is provided and a first set of via holes 304 are formed. Then, a thin layer of metal is formed on the first layer of ceramic green tape 302 as a first ground plane 300. In FIG. 6C, a first transmission line segment 306, having a first width and a second width narrower than the first width, is deposited (e.g., screen printed as a conductive paste) on the first layer of ceramic green tape 302 and conductive paste fills the first set of via holes 304. A second set of via holes 310 are formed in a second layer of ceramic green tape 308, which is subsequently placed over the first transmission line segment 306 (FIG. 6D). As seen in FIG. 6E, a second ground plane 312 is then placed on the second layer of green tape 308 (including accommodations for via holes as discussed relative to FIG. 5). The process is then repeated to build additional layers, with a third green tape layer 314 placed on the second ground plane 312 (FIG. 6F), and a second transmission line segment 316 being formed on the third green tape layer 314, and having a third width and a fourth width narrower than the third width (the latter of which is of such value as to substantially approximate the characteristic impedance resulting from the second width of the first transmission line segment). A third transmission line segment 318 is also formed. Input and output electrodes are formed as desired. Via connections in the device may themselves be generally straight (e.g., vertical) or tapered.

The preferred embodiment has been described herein as being constructed with ceramic material. Of course, it will be recognized that other materials and fabrication methods may likewise be employed to realize the multilayered, tapered transmission line device, including but not limited to non-ceramic, multilayered, organic printed circuit board materials and fabrication techniques.

Figure 7:
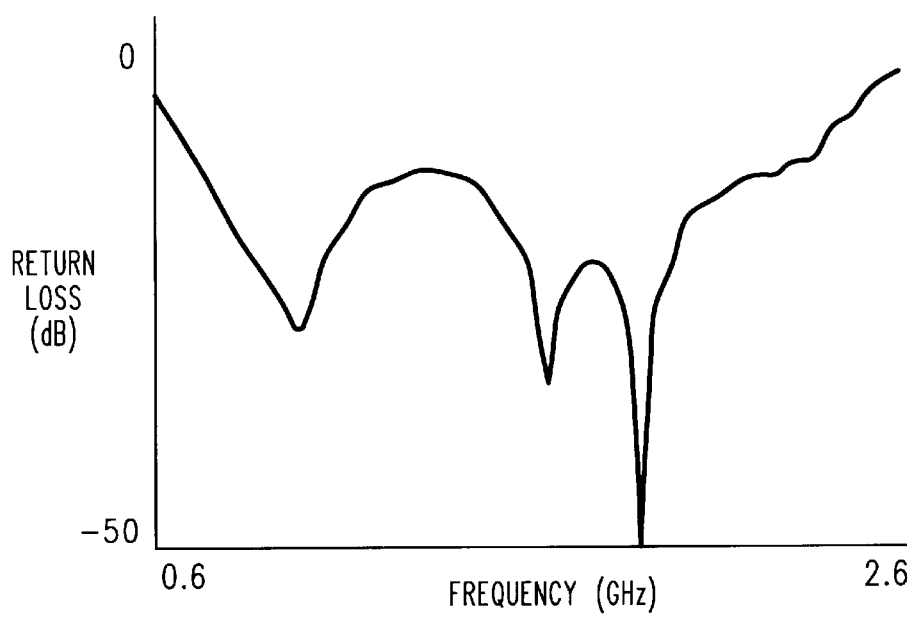
FIG. 7 is a graph of frequency ranges for illustrating the versatility of one preferred multilayer ceramic package of the present invention.

Referring to FIG. 7, it is seen the versatility afforded by the technology of the present invention. Preferably, the packaged devices of the present invention provide impedance matching and a Return Loss of higher than 10 dB over a broad range of frequencies. More specifically, a preferred device exhibits a Return Loss of higher than about 10 dB over the frequency ranges of 800 MHz to 915 MHz and 1700 MHz to 2100 MHz. In one preferred embodiment, for matching between about 4 Ohms and about 20 Ohms, a device in accordance with the present invention exhibiting about 15 dB Return Loss has a bandwidth of about 700 MHz to about 2.3 GHz.

Figure 8:
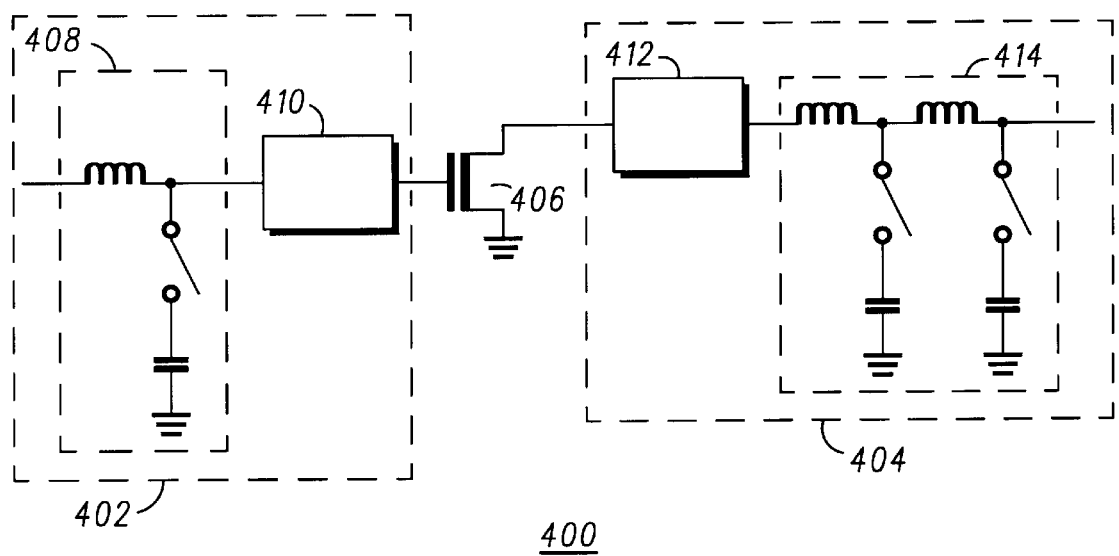
FIG. 8 is a schematic depiction of a device incorporating a multilayer ceramic package in accordance with the present invention.

Multilayer ceramic package devices in accordance with the present invention thus find use in a number of different applications, particularly in radio frequency applications. By way of example, without limitation, FIG. 8 depicts the use of two such devices in a wideband amplifier 400. The device 400 includes an input portion 402 and an output portion 404. The input portion 402 may be in signaling communication with suitable radio frequency circuitry (e.g., an amplifier or the like; not shown). The output portion 404, in turn, may be in signaling communication with a suitable output device (e.g., an antenna; not shown). The input portion 402 and the output portion 404 are linked by a suitable transistor 406. In a preferred device, the input portion 402 includes an input matching network 408 associated with a step-down transformer (i.e., a first multilayer ceramic package device 410), which in turn interfaces with the transistor 406. The output portion 404 interfaces with the transistor 406 by way of a step-up transformer (i.e., a second multilayer ceramic package device 412), which is associated with an output matching network 414 for interfacing with an output device.

Of course, it will be recognized that many other combinations may likewise be employed, including but not limited to eliminating networks 408 and/or 414, the use of more than one multilayer ceramic package device for each of the input or output portions, or the separate or individual fabrication or use of input and output portions.

The transformer capabilities of the multilayer ceramic package devices permit for many different ranges of impedance transformations ranging from about 0.1:1 to about 10:1, and more particularly about 0.2:1 to about 5:1. Higher or lower transformations are also possible. In one highly preferred embodiment, a transformer having the transmission line configuration of FIG. 1 can exhibit at least as high as a 5:1 transformation ratio yet the package size will not exceed about 400 mils by about 50 mils by about 125 mils. Accordingly, the need is met for an improved impedance matching transformer, which is useful over a broad range of frequencies that can be efficiently incorporated into minute size applications, such as software definable radio applications.

Figure 9:
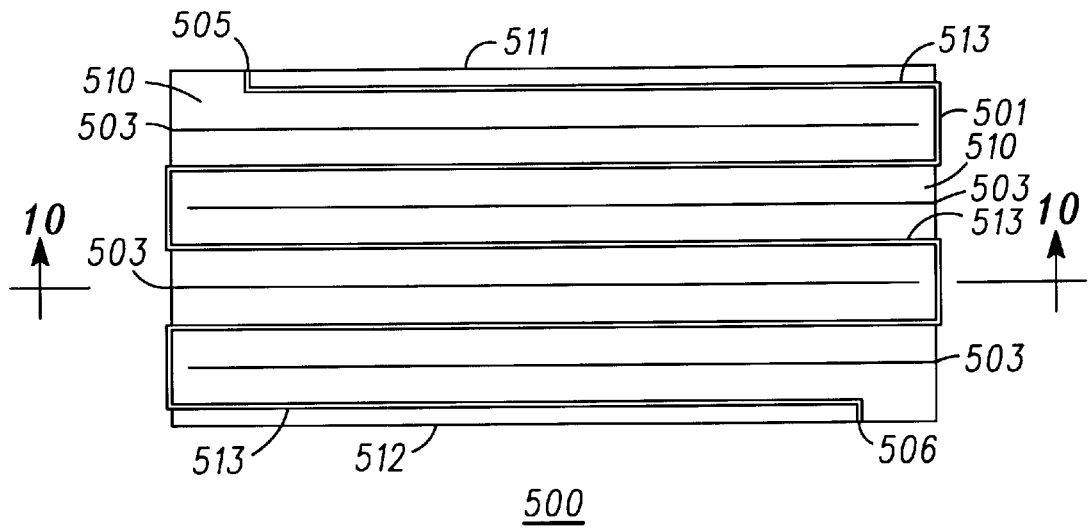
FIG. 9 illustrates a top view of a possible configuration that uses edge wrapping between layers.

FIG. 9 depicts an alternate embodiment of a ceramic package 500 that utilizes edgewrapping to make conductive connections between the various layers. This embodiment shows a plurality of dielectric layers 510 interspersed with transmission line segments 513 and ground layers 503. A first port 505 and a second port 506 are formed on the surfaces of the device by providing electrical isolation from the top ground layer 511 and bottom ground layer 512. In this embodiment, the transmission line segments 513 are connected using edge-wrapping 501 with an electrically conductive material.

Figure 10:
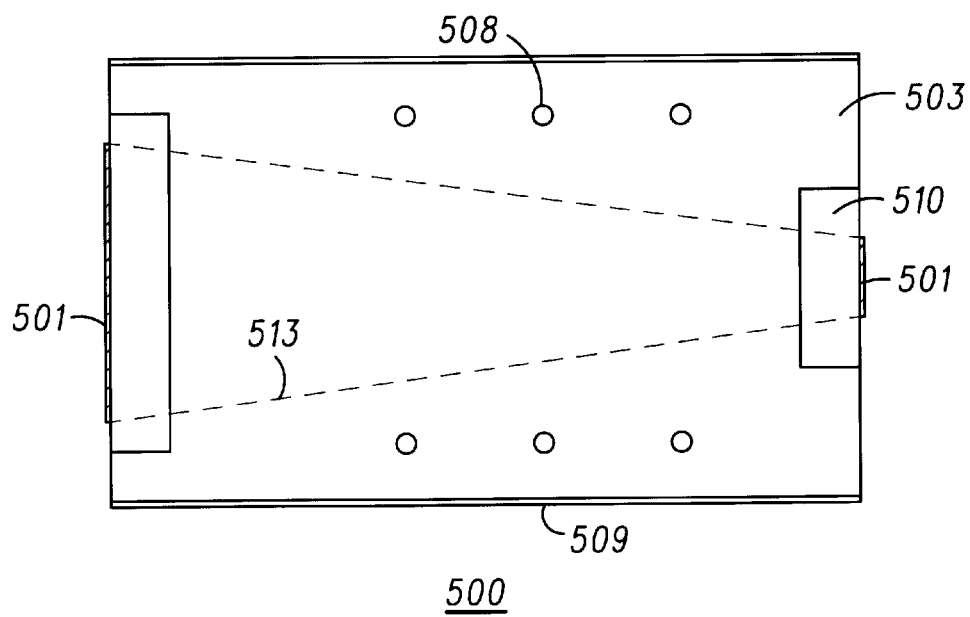
FIG. 10 illustrates a side sectional view of a possible configuration that uses edge wrapping between layers.

FIG. 10 illustrates a cross-section of FIG. 9 taken along line 10—10. The ground plane 503 is electrically isolated from the transmission line segment 513 and the line segment wrapping 501. In addition, the ground plane 503 is electrically connected to other ground plane layers by way of edge-wrapping 509 and/or via connections 508.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A tapered transmission line ceramic device, comprising:
   a first ground layer;
   a first dielectric layer over at least a portion of said first ground layer;
   a first tapered portion of a tapered transmission line on said first dielectric layer, said first tapered portion tapering from a first width to a second width less than said first width;
   a second dielectric layer over said first tapered portion;
   a second ground layer over at least a portion of said second dielectric layer;
   a third dielectric layer over at least a portion of said second ground layer;
   a second tapered portion of another tapered transmission line on said third dielectric layer, said second tapered portion tapering from a third width to a fourth width less than said third width, said third width substantially approximating the characteristic impedance resulting from said second width; and
   a structure in spaced relationship to each of said ground layers for signally connecting said first tapered portion to said second tapered portion.

2. A device according to claim 1, wherein said device includes terminal ports on the same side of said device.

3. A device according to claim 1, wherein said device exhibits Return Loss representing an acceptable impedance transformation over the frequency ranges from 800 MHz to 915 MHz and 1700 MHz to 2100 MHz.

4. A device according to claim 1, wherein said first tapered portion and said second tapered portion each have a longitudinal axis that is substantially parallel to each other.

5. A device according to claim 4 wherein said longitudinal axes are substantially juxtaposed relative to each other.

6. A device according to claim 1, wherein if placed end to end, said first tapered portion and said second tapered portion would exhibit an exponentially tapering line.

7. A device according to claim 1, wherein if laid end to end, said first tapered portion and said second tapered portion would exhibit an inversion point along their length.

8. A device according to claim 1, wherein said device is adapted to be incorporated into a software definable radio device.

9. A device according to claim 1, wherein said device includes terminal ports on opposing sides of said device.

10. A radio frequency signal communication system, comprising:
    (a) a first lumped element matching network;
    (b) a first impedance transformer device in signaling communication with the first lumped element matching network and exhibiting characteristics of a tapered transmission line device, said device exhibiting a Return Loss representing an acceptable impedance transformation over the frequency ranges from 800 MHz to 915 MHz and 1700 MHz to 2100 MHz when terminated with a selected impedance; and
    c) wherein said transformer device includes a first ground layer;
    a first dielectric layer over at least a portion of said first ground layer;
    a first tapered portion of a tapered transmission line on said first dielectric layer, said first tapered portion tapering from a first width to a second width less than said first width;
    a second dielectric layer over said first tapered portion;
    a second ground layer over at least a portion of said second dielectric layer;
    a third dielectric layer over at least a portion of said second ground layer;
    a second tapered portion of another tapered transmission line on said third dielectric layer, said second tapered portion tapering from a third width to a fourth width less than said third width, said third width substantially approximating the characteristic impedance resulting from said second width; and
    a structure for signally connecting said first tapered portion to said second tapered portion.

11. A system according to claim 10, further comprising a radio frequency output element including an antenna in signaling communication with said first matching network.

12. A system according to claim 11, wherein said first matching network is associated with an output of said system.

13. A system according to claim 10, further comprising a transistor in signaling communication with said first impedance transformer device.

14. A system according to claim 13, further comprising a second impedance transformer device in signaling communication with said transistor and exhibiting characteristics of a tapered transmission line device, said device exhibiting a Return Loss representing an acceptable impedance transformation over at least one of the frequency ranges from 800 MHz to 915 MHz and 1700 MHz to 2100 MHz when terminated with a selected impedance; and
    a second matching network in signaling communication between said second impedance transformer device and an input circuit.

15. A system according to claim 14, wherein said second matching network is associated with an input of said system.

16. A method for making a multilayer tapered transmission line device, comprising the steps of:
   a) providing a first dielectric layer having first and second opposed sides;
   b) placing a first ground plane on said first side of said dielectric layer;
   c) forming a first transmission line segment on said second side of said dielectric layer;
   d) forming a second dielectric layer on said first transmission line segment;
   e) forming a second ground plane on said second dielectric layer;
   f) forming a third dielectric layer on said second ground plane;
   g) forming a second transmission line segment on said third dielectric layer;
   h) said second transmission line segment being tapered relative to said first transmission line segment and exhibiting a reduction in width relative to said first transmission line segment;
   i) conductively connecting said first and second transmission line segments; and
   j) electrically isolating said ground planes relative to said transmission line segments.

17. A method according to claim 16, wherein said second ground plane is placed over a plurality of dielectric layers.

* * * * *